US006859045B2

(12) United States Patent
Fernandez

(10) Patent No.: US 6,859,045 B2
(45) Date of Patent: Feb. 22, 2005

(54) CABLE-TESTING ADAPTER

(76) Inventor: Javier Fernandez, P.O. Box 394, Hamlin, PA (US) 18427

( * ) Notice: Subject to any disclaimer, the term of this patent is extended or adjusted under 35 U.S.C. 154(b) by 0 days.

(21) Appl. No.: 10/318,993

(22) Filed: Dec. 13, 2002

(65) Prior Publication Data
US 2003/0132757 A1 Jul. 17, 2003

Related U.S. Application Data

(63) Continuation-in-part of application No. 09/841,073, filed on Apr. 25, 2001, now Pat. No. 6,512,378.
(51) Int. Cl.$^7$ .............................. H04B 3/46; G01R 19/00
(52) U.S. Cl. ......................................... 324/539; 324/66
(58) Field of Search ................................ 324/538–543, 324/66, 67

(56) References Cited

U.S. PATENT DOCUMENTS 4,380,731 A * 4/1983 Alker .......................... 324/538
5,570,029 A * 10/1996 Bottman et al. ............. 324/628

* cited by examiner

Primary Examiner—Vincent Q. Nguyen
(74) Attorney, Agent, or Firm—Pitney Hardin LLP

(57) ABSTRACT

A cable-testing arrangement for rapidly testing a plurality of telecommunications cables includes a cable-testing adapter by which test signals can be directed along the plurality of cables from a patch panel at once. A technician completes the tests by making appropriate measurements at the terminations of the cables without having to return to the patch panel until all measurements have been taken.

24 Claims, 4 Drawing Sheets

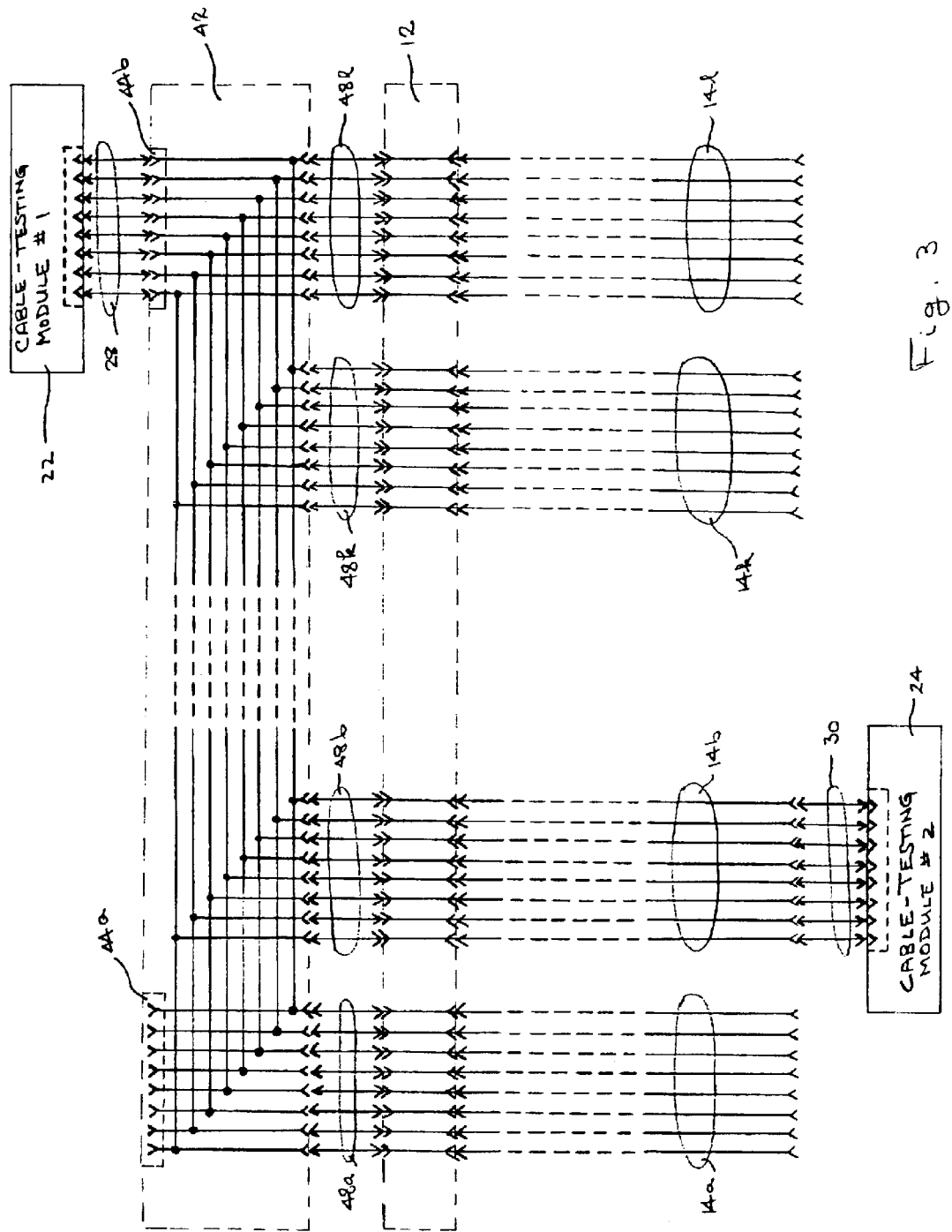

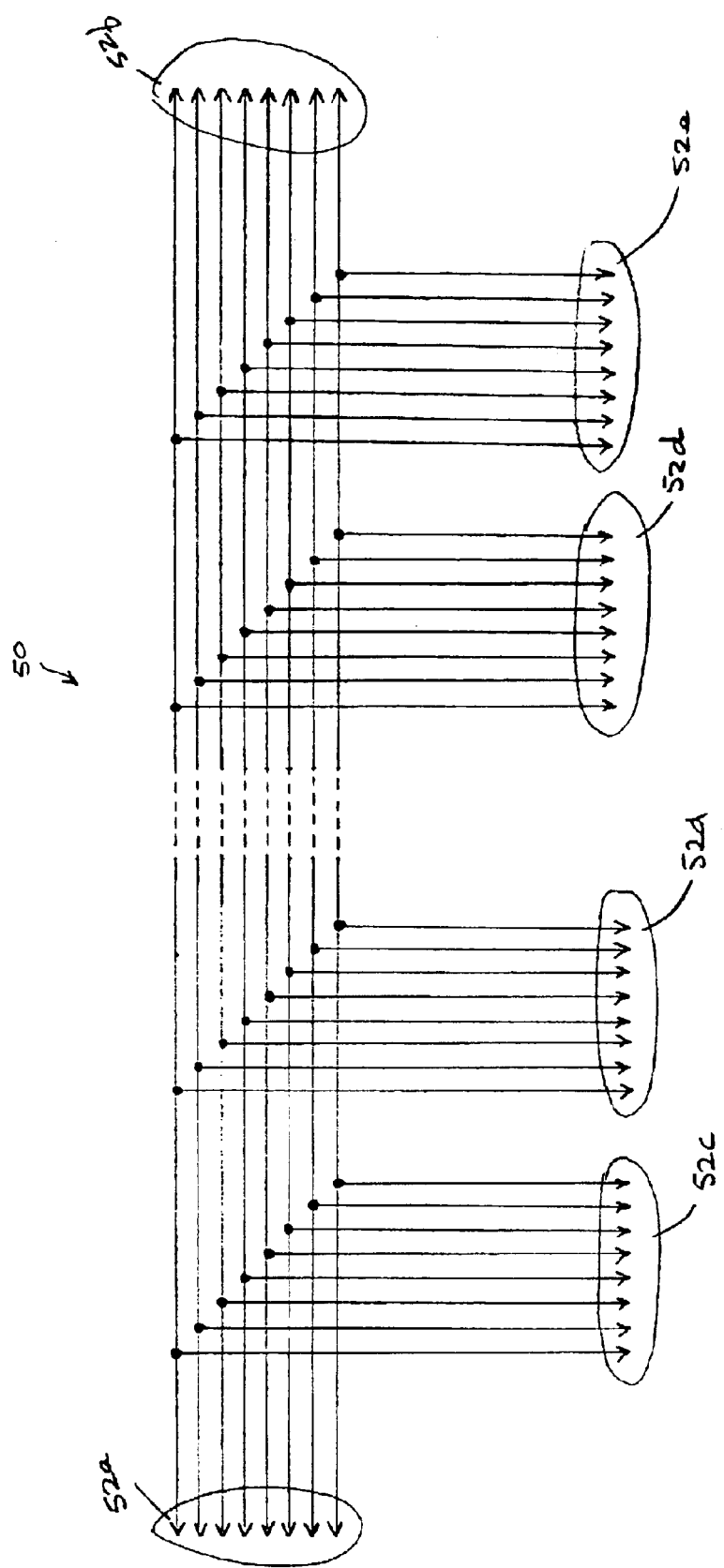

CABLE-TESTING ADAPTER

CROSS-REFERENCE TO RELATED APPLICATION

This is a continuation-in-part (CIP) of U.S. patent application Ser. No. 09/841,073, filed Apr. 25, 2001 now U.S. Pat. No. 6,512,378.

BACKGROUND OF THE INVENTION

1. Field of the Invention

The present invention relates to the testing of telecommunications cable having a plurality of conductors. More specifically, the present invention relates to the testing of a plurality of such cables, which radiate from a patch panel to respective termination points in a building.

2. Description of the Prior Art

Cable testers are used to verify the electrical integrity of multiconductor telecommunications cable and their terminations. Such cables include, but are not limited to, telephone and computer cables which radiate from a service closet to offices and other rooms or locations in a building for individual telephone or computer service. Generally, cables of this variety have an even-numbered plurality of conductors forming at least one pair, although they may alternatively have an odd-numbered plurality of conductors. For example, the commonly used "Category 5" and "Category 6" telecommunications cables have eight conductors forming four pairs.

The cable testers themselves generally have two cable-testing modules, one of which is connected to each end of the cable being tested, for sending and receiving electric signals along the conductors in the cable. One, and possibly both, of the modules has a readout display which indicates the electrical integrity of each conductor in the cable to the technician conducting the test.

Typically, the service closet referred to above houses a patch panel where connections to the cables radiating therefrom may be made. In order to test a cable, one of the two cable-testing modules is connected thereto at the patch panel, while the other of the two cable-testing modules is attached to its termination elsewhere in the building. The technician conducting the test then checks the readout display on one of the two modules to verify the electrical integrity of the conductors making up the cable.

Heretofore, it was necessary for the technician, or technicians, carrying out the tests to return to the service closet to connect one of the two cable-testing modules to another cable at the completion of one test, and then to proceed to the termination of the latter cable to complete its testing. It will immediately become apparent to the reader that many time-consuming trips between the service closet and terminations, possibly remote or on different floors of the building, by the technician may be required to complete the testing of all of the cables. While the use of a second technician, who remains in the service closet and connects one of the two cable-testing modules to another cable at the completion of each test, while the original technician proceeds from one termination to the next and communicates, perhaps by cell phone or walkie-talkie, with the second technician, may speed up the testing process, it requires the availability of a second technician, entailing additional costs.

Clearly, there is a need in the telecommunications industry to improve the efficiency of and to reduce the costs associated with the testing of telecommunications cable. The present invention provides a response to this need.

SUMMARY OF THE INVENTION

Accordingly, the present invention is a cable-testing arrangement for rapidly testing a plurality of telecommunications cables which run from a patch panel to separate remote terminations. Each of the cables has a plurality of conductors. The cable-testing arrangement comprises a first cable-testing module for sending or receiving electrical test signals through each of the cables.

The cable-testing arrangement also includes a cable-testing adapter. The adapter has at least one input connector and a plurality of output connectors. The first cable-testing module is connected to an input connector with a first test cable. The input connector is electrically connected in parallel to each of the output connectors.

The arrangement also includes a patch panel with a plurality of connectors, one for each of the plurality of telecommunications cables being tested. The patch panel is connected to the cable-testing adapter by a plurality of patch cables which run from the output connectors to the connectors on the patch panel. As a result, the cable-testing adapter connects the first cable-testing module in parallel to the telecommunications cables being tested.

The cable-testing arrangement finally includes a second cable-testing module for sending or receiving signals to or from the first cable-testing module. The second cable-testing module is connected to the termination of any one of the plurality of telecommunications cables with a second test cable to test that one cable individually.

The present invention makes it possible for a technician to test each of the plurality of telecommunications cables individually by proceeding from termination to termination with the second cable-testing module without changing the connection of the first cable-testing module at the patch panel until all of the plurality of telecommunications cables have been tested, because the adapter connects the first cable-testing module in parallel to all of the plurality of telecommunications cables being tested.

The present invention will now be described in more complete detail with frequent reference being made to the drawings identified below.

BRIEF DESCRIPTION OF THE DRAWINGS

FIG. 3 is a schematic circuit diagram of the cable-testing arrangement of FIG. 2; and FIG. 4 is a schematic diagram of an alternate embodiment of the cable-testing adapter of the present invention.

DETAILED DESCRIPTION OF THE PREFERRED EMBODIMENT

Figure 1:
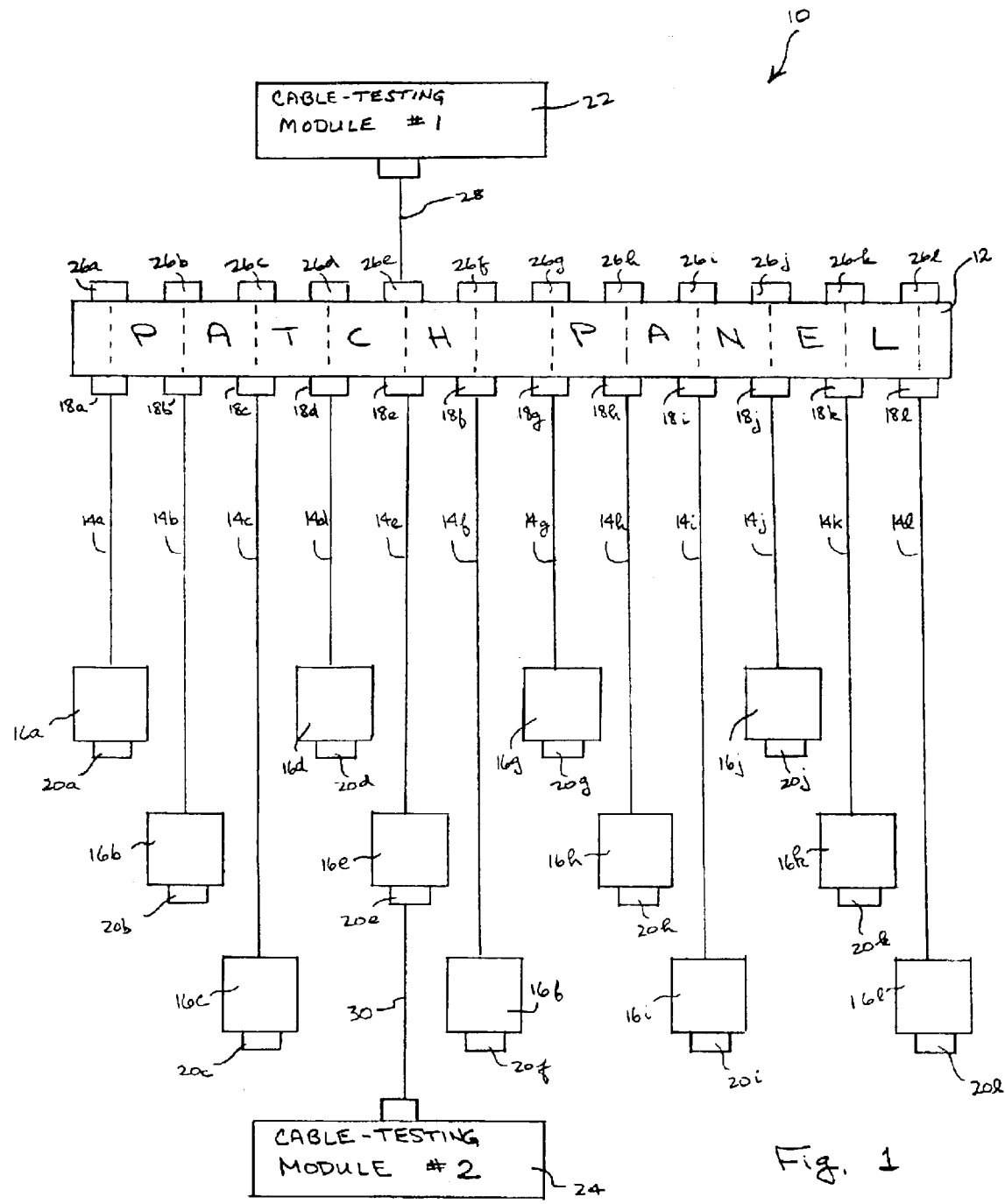
FIG. 1 is a schematic representation of a cable-testing arrangement of the prior-art.

Turning now to FIG. 1, a schematic representation of a cable-testing arrangement 10 of the prior art, a patch panel 12, located in a service closet or the like, is the origin of telecommunications cables 14a through 14l, which radiate therefrom to terminations 16a through 16l, respectively, in individual offices or other locations remote from the service closet. For the sake of simplicity, twelve cables 14a though 14l and their respective terminations 16a through 16l are shown. In practice, the number of cables and their respective terminations may be much larger than twelve, as the patch panel 12 may serve many more offices or other locations in the building.

Cables 14a through 14l typically have an even-numbered plurality of conductors forming at least one pair, although they may alternatively have an odd-numbered plurality of conductors. They may, for example, be "category 5" or "category 6" cables having eight conductors forming four pairs. However, the inventor has no intention to limit the present invention to conductors of these types.

Cables 14a through 14l are connected to patch panel 12 using connectors 18a though 18l of a variety well-known to those of ordinary skill in the art. For example, connectors 18a through 18l may be "110" connectors, by which cables 14a through 14l are essentially hard-wired to the patch panel 12.

Terminations 16a through 16l may have connectors 20a through 20l, respectively, which are also of a variety well known to those of ordinary skill in the art. For example, connectors 20a through 20l may be RJ-45 connectors, wherein RJ-45 plugs on cables from telephones or computers connect with RJ-45 jacks in terminations 16a through 16l, respectively.

The cable tester comprises two modules, cable-testing module #1 (22) and cable-testing module #2 (24), at least one of which has a readout display to enable the technician, or technicians, conducting the test to evaluate the electrical integrity of each conductor in the cable being tested. The cable tester may, for example, be one of a variety commonly used by those of ordinary skill in the art to test the continuity of the conductors making up the cable using D.C. (direct current). Such testers typically check for shorts, opens, reversals and mixed pairs.

Cable-testing module #1 (22) is connected to one of connectors 26a through 26l on patch panel 12. Connectors 26a through 26l communicate electrically with cables 14a through 14l, respectively. For purposes of illustration, cable testing module #1 (22) is connected to connector 26e so that cable 14e may be tested. Connectors 26a through 26l may, for example, be RJ-45 jacks.

Cable-testing module #1 (22) is connected to connector 26e by a test cable 28 having an appropriate connector, such as an RJ-45 plug. The test cable 28, like the cables 14a through 14l being tested, may have an even-numbered plurality of conductors forming at least one pair, and is preferably the same kind of cable as that being tested. For example, test cable 28 has eight conductors forming four pairs where the cables 14a through 14l are "category 5" or "category 6" telecommunications cables.

Similarly, cable-testing module #2 (24) is connected to connector 20e by a test cable 30 having an appropriate connector, such as an RJ-45 plug. Test cable 30 is the same kind of cable as test cable 28, and the remarks made in the preceding paragraph with respect to test cable 28 apply equally to test cable 30.

Cable-testing module #1 (22) and cable-testing module #2 (24) send and receive electric signals along the conductors making up cable 14e. At least one of the modules 22, 24 has a readout display to indicate the electrical integrity of each conductor in the cable 14e.

It will be clear to the reader who studies FIG. 1 that both modules 22, 24 must be moved by the technician, or technicians, to test another of cables 14a through 14l than cable 14e. That is to say more clearly, test cable 28 must be attached to a different connector 26a through 26l than connector 26e at patch panel 12, while cable-testing module #2 (24) and test cable 30 must be disconnected from connector 20e and moved to a different office, room or other location in the building where the cable 14e through 14l corresponding to the connector 26a through 26l to which the test cable 28 is newly connected, terminates. Needless to say, these steps are very repetitive and time-consuming, and render the testing less efficient and more expensive than it need be.

Figure 2:
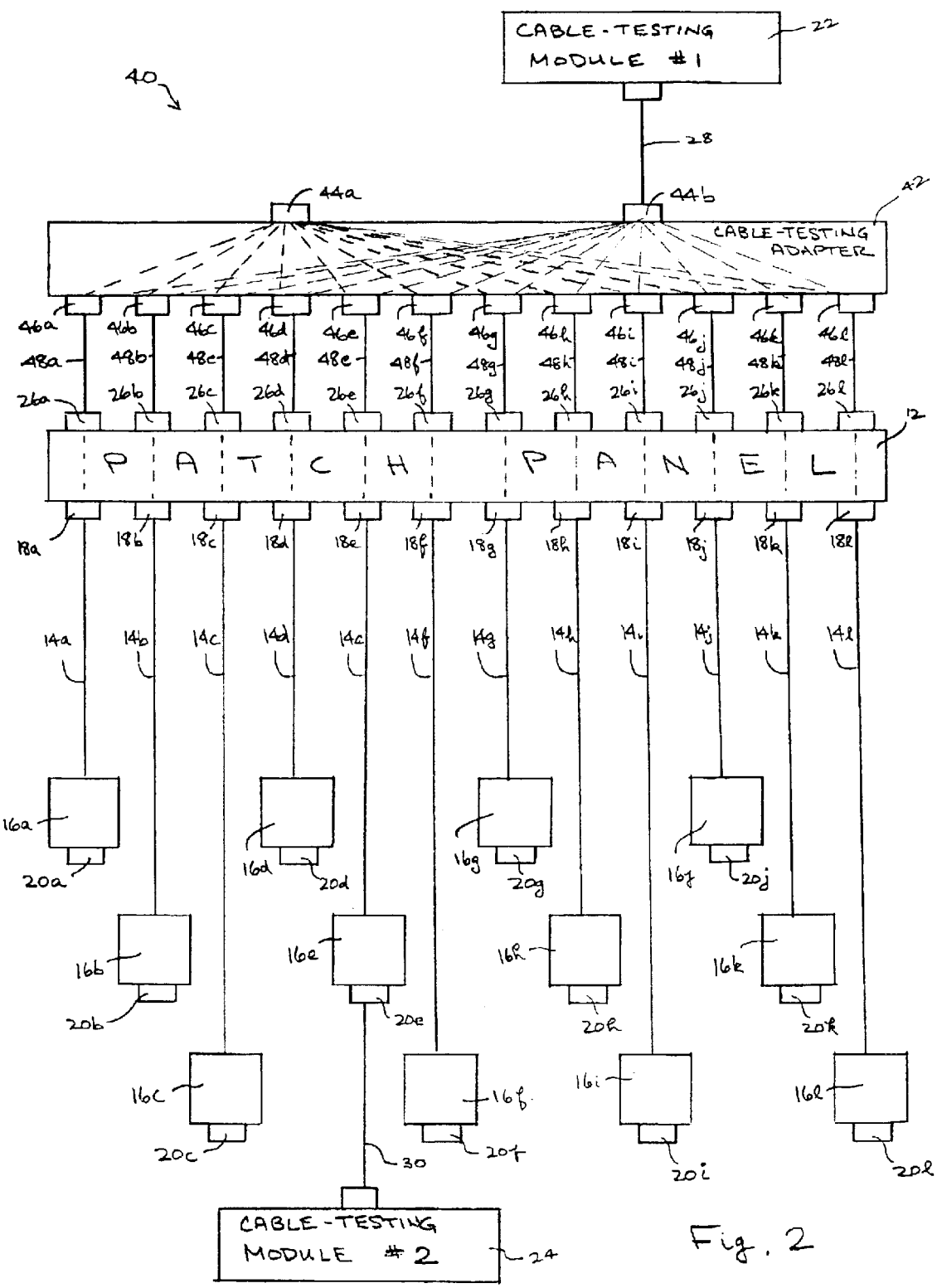
FIG. 2 is a schematic representation of a cable-testing arrangement incorporating the cable-testing adapter of the present invention.

Referring now to FIG. 2, a schematic representation of a cable-testing arrangement 40 incorporating the cable-testing adapter 42 of the present invention, cable-testing arrangement 40 includes all of the elements described above for cable-testing arrangement 10. For this reason, elements appearing in both FIGS. 1 and 2 have the same drawing reference numbers as were used in FIG. 1. The description of those elements given above with reference to FIG. 1 applies equally to FIG. 2 and will not be repeated.

In cable-testing arrangement 40, the cable-testing adapter 42 of the present invention is interposed between patch panel 12 and cable-testing module #1 (22). Cable-testing adapter 42 has two input connectors 44a, 44b, which may be RJ-45 jacks, whereby test cable 28 having an appropriate connector, which may be an RJ-45 plug, may be connected to attach cable-testing module #1 (22) to the adapter 42. As shown in FIG. 2, input connector 44b has been used. As will become clear, below, input connector 44a could be used to equal effect. In any event, as will also become clear, the unused one of input connectors 44a, 44b may be used to connect cable-testing adapter 42 to a second cable-testing adapter of the same type in order to test twice as many cables at the same time.

In addition to input connectors 44a, 44b, cable-testing adapter 42 has twelve output connectors 46a through 46l, which may also be RJ-45 jacks. Patch cables 48a through 48l, having appropriate connectors at each end, such as RJ-45 plugs, are used to attach connectors 46a through 46l of cable-testing adapter 42 to connectors 26a through 26l, respectively, on patch panel 12.

Within cable-testing adapter 42, both input connectors 44a, 44b are connected in parallel to output connectors 46a through 46l. As a consequence, cable-testing module #1 (22), when attached by test cable 28 to either input connector 44a, 44b, can send or receive an electric test signal along any one of telecommunications cables 14a through 14l. This enables a technician to carry cable-testing module #2 (24), which preferably has a readout display, from one termination 16a through 16l to the next, testing each cable 14a through 14l by receiving the signal sent by cable-testing module #1 (22) and viewing the readout display without having to return to the service closet until all cables 14a through 14l have been tested.

Moreover, the input connector 44a, 44b not connected to cable-testing module #1 (22) by test cable 28 may be used to connect cable-testing adapter 42 to one or more of the same type to connect additional telecommunication cables radiating from the patch panel 12 in parallel with cable-testing module #1 (22), thereby enabling a technician to test more telecommunications cables than cables 14a through 14l before having to return to the service closet.

FIG. 3 is a schematic circuit diagram of a cable-testing arrangement shown in FIG. 2 for the case where cables 14a through 14l being tested have eight conductors forming four pairs. Cable-testing adapter 42 includes the electrical connections shown schematically in the upper of the two dashed-line boxes in FIG. 3. It will be readily apparent to one of ordinary skill in the art that the cross connections, which are the horizontal lines in the dashed-line box representing the cable-testing adapter 42, connect cables 14a through 14l in parallel with one another by electrically connecting the eight conductors in each cable 14*a* through 14*l* to those corresponding thereto in the other cables 14*a* through 14*l*. As a consequence, cable-testing module #1 (22), when connected by test cable 28 to input connector 44*b*, can send test signals through patch cables 48*a* through 48*l*, which connect the adapter 42 to cables 14*a* through 14*l* through patch panel 12. The test signals, in turn, can be received by cable-testing module #2 (24) at the termination of any one of cables 14*a* through 14*l*, for example cable 14*b* as shown in FIG. 3, without having to move cable-testing module #1 (22) until all cables 14*a* through 14*l* have been tested. Moreover, input connector 44*a* may be used to connect adapter 42 to another adapter 42 so that additional cables can be tested without having to move cable-testing module #1 (22).

An appropriately designed circuit board may be used in cable-testing adapter 42 to make the required electrical connections between input connectors 44*a*, 44*b* and output connectors 46*a* through 46*l*.

It should be understood that cable-testing adapter 42 need not be a unit separate from cable-testing module #1 (22). That is to say, more specifically, cable-testing adapter 42 may be incorporated within cable-testing module #1 (22), that is, it may be built into cable-testing module #1 (22), so that both may be included within a single housing. Such an improved cable-testing module #1 would have twelve (or more) output connectors, corresponding to output connectors 46*a* through 46*l*, for connecting it to a patch panel using patch cables, and may further have an additional connector, analogous to unused input connector 44*a* in FIGS. 2 and 3, to connect the improved cable-testing module #1 to a cable-testing adapter 42 to enable a technician to test a greater number of telecommunications cables than cable-testing module #1 alone would permit before having to return to the service closet.

Modifications to the above would be obvious to those of ordinary skill in the art, but would not bring the invention so modified beyond the scope of the appended claims.

For example, bearing in mind that, in cable-testing adapter 42, input connectors 44*a*, 44*b* are connected in parallel to output connectors 46*a* through 46*l*, so that cable-testing module #1 (22) may be connected in parallel to connectors 26*a* through 26*l* on patch panel 12, it will be readily apparent to one of ordinary skill in the art that such a result could be achieved in other ways without departing from the scope of the present invention. FIG. 4 is a schematic diagram of an alternate embodiment of the cable-testing adapter of the present invention.

Referring specifically to FIG. 4, cable-testing adapter 50, which physically may take the form of a plurality of connectors, such as RJ-45 plugs, connected in parallel with one another by relatively short lengths of cable like a string of holiday lights, has six connectors 52*a* through 52*f*, although the dashed lines are provided to suggest that any number of connectors could be included. In use, one of the connectors 52*a* through 52*f* would be connected to cable-testing module #1 (22), while the others would be inserted in connectors on the patch panel to test cables radiating therefrom. As a result, cable-testing module #1 (22) would be connected in parallel to the telecommunications cables radiating from the connectors used on the patch panel.

What is claimed is:

1. A cable-testing arrangement for rapidly testing a plurality of telecommunications cables, said telecommunications cables running from a patch panel to separate remote terminations, each of said cables having a plurality of conductors, said cable-testing arrangement comprising:

a first cable-testing module for sending or receiving electrical test signals through each of said cables;

a cable-testing adapter, said cable-testing adapter having at least one input connector and a plurality of output connectors, said cable-testing adapter being connected at said input connector to said first cable-testing module with a first test cable having a plurality of conductors, said at least one input connector being electrically connected in parallel to each of said output connectors;

a patch panel having a plurality of connectors, one being for each of said plurality of telecommunications cables being tested, said patch panel being connected to said cable-testing adapter by a plurality of patch cables, each of said patch cables having a plurality of conductors, each of said patch cables connecting an output connector of said cable-testing adapter to a connector on said patch panel; and a second cable-testing module for sending or receiving signals to or from said first cable-testing module, said second cable-testing module being connected to the termination of any one of said plurality of telecommunications cables with a second test cable having a plurality of conductors to test said cable individually, whereby each of said plurality of telecommunications cables is tested individually by connecting said second cable-testing module to their respective terminations without changing the connection of said first cable-testing module before all of said plurality of telecommunications cables have been tested.

2. A cable-testing arrangement as claimed in claim 1 wherein said plurality of conductors in each of said telecommunications cables is eight.

3. A cable-testing arrangement as claimed in claim 1 wherein said plurality of telecommunications cables is twelve.

4. A cable-testing arrangement as claimed in claim 1 wherein at least one of said first and second cable-testing modules has a readout display.

5. A cable-testing arrangement as claimed in claim 1 wherein said cable-testing adapter has two input connectors, one being connected to said first cable-testing module and the other being connected to a second cable-testing adapter, so that additional telecommunications cables may be tested without changing the connection of said first cable-testing module.

6. A cable-testing arrangement as claimed in claim 1 wherein said plurality of conductors in said first test cable is eight.

7. A cable-testing arrangement as claimed in claim 1 wherein said plurality of conductors in said second test cable is eight.

8. A cable-testing arrangement as claimed in claim 1 wherein said plurality of conductors in said patch cables is eight.

9. A cable-testing arrangement as claimed in claim 1 wherein said plurality of patch cables is twelve.

10. In a cable-testing arrangement for testing a plurality of telecommunications cables, said telecommunications cables running from a patch panel to separate remote terminations, each of said cables having a plurality of conductors, wherein a first cable-testing module sends or receives electrical test signals through a first test cable having a plurality of conductors to or from an individual telecommunication cable at said patch panel, and a second cable-testing module sends or receives electrical test signals through a second test cable having a plurality of conductors at the termination of said telecommunications cable, the improvement comprising:

a cable-testing adapter, said cable-testing adapter having at least one input connector and a plurality of output connectors, said cable-testing adapter being connected at said input connector to said first cable-testing module with said first test cable, and being connected to said plurality of telecommunications cables by a plurality of patch cables, each of said patch cables having a plurality of conductors, said patch cables connecting said output connectors of said adapter to said plurality of telecommunications cables at their respective connectors at said patch panel, said at least one input connector being electrically connected in parallel to each of said output connectors, whereby each of said plurality of telecommunications cables is tested individually by connecting said second cable-testing module to their respective terminations without changing the connection of said first cable-testing module before all of said plurality of telecommunications cables have been tested.

11. The improvement as claimed in claim 10 wherein said plurality of conductors in each of said telecommunications cables is eight.

12. The improvement as claimed in claim 10 wherein said plurality of telecommunications cables is twelve.

13. The improvement as claimed in claim 10 wherein said cable-testing adapter has two input connectors, one being connected to said first cable-testing module and the other being connected to a second cable-testing adapter, so that additional telecommunications cables may be tested without changing the connection of said first cable-testing module.

14. The improvement as claimed in claim 10 wherein said plurality of conductors in said first test cable is eight.

15. The improvement as claimed in claim 10 wherein said plurality of conductors in said second test cable is eight.

16. The improvement as claimed in claim 10 wherein said plurality of conductors in said patch cables is eight.

17. The improvement as claimed in claim 10 wherein said plurality of patch cables is twelve.

18. A circuit element for a cable-testing arrangement, said circuit element having at least one input connector for connecting a cable having a plurality of conductors thereto and a plurality of output connectors for connecting a plurality of cables having a plurality of conductors thereto, said input connector being electrically connected in parallel to each of said output connectors, wherein said plurality of output connectors is twelve.

19. A circuit element for a cable-testing arrangement, said circuit element having at least one input connector for connecting a cable having a plurality of conductors thereto and a plurality of output connectors for connecting a plurality of cables having a plurality of conductors thereto, said input connector being electrically connected in parallel to each of said output connectors, wherein said input connectors and said output connectors are connected to one another in parallel by lengths of cable in the manner of a string of holiday lights.

20. In a cable tester having a first cable-testing module and a second cable-testing module for testing a plurality of telecommunications cables, said telecommunications cables running from a patch panel to separate remote terminations, each of said cables having a plurality of conductors, wherein said first cable-testing module sends or receives electrical test signals through an individual telecommunications cable at said patch panel to or from said second cable-testing module at the termination of said telecommunications cable, the improvement comprising:

a first cable-testing module incorporating a cable-testing adapter therewithin, said cable-testing adapter having an input connector and a plurality of output connectors, said input connector being electrically connected to a circuit of said first cable-testing module and being electrically connected in parallel to said output connectors, whereby said first cable-testing module is connected to a plurality of telecommunications cables at a patch panel by a plurality of patch cables attached to said output connectors so that each of said plurality of telecommunications cables is tested individually by connecting said second cable-testing module to their respective terminations without changing the connection of said first cable-testing module before all of said plurality of telecommunications cables have been tested.

21. The improvement as claimed in claim 20 wherein said plurality of conductors in said telecommunications cables is eight.

22. The improvement as claimed in claim 20 wherein said plurality of telecommunications cables is twelve.

23. The improvement as claimed in claim 20 wherein said first cable-testing module incorporating said cable-testing adapter therewithin has an additional connector connected in parallel to said plurality of output connectors for connecting an additional cable-testing adapter thereto.

24. A method for testing a plurality of telecommunications cables, each of said cables having a plurality of conductors, said telecommunications cables running from a patch panel to separate remote terminations, said method comprising the steps of:

connecting said plurality of communications cables electrically to one another in parallel at said patch panel;

attaching said parallel-connected plurality of telecommunications cables to a first cable-testing module for sending or receiving electrical test signals through said communications cables; and attaching a second cable-testing module for sending or receiving said signals one at a time to said remote terminations of said plurality of telecommunications cables to test each of said cables individually.

* * * * *